(12) United States Patent
Chen

(10) Patent No.: US 9,380,705 B2
(45) Date of Patent: Jun. 28, 2016

(54) LATERALLY COUPLED ISOLATOR DEVICES

(71) Applicant: Analog Devices, Inc., Norwood, MA (US)

(72) Inventor: Baoxing Chen, Westford, MA (US)

(73) Assignee: Analog Devices, Inc., Norwood, MA (US)

( * ) Notice: Subject to any disclaimer, the term of this patent is extended or adjusted under 35 U.S.C. 154(b) by 233 days.

(21) Appl. No.: 13/803,826

(22) Filed: Mar. 14, 2013

(65) Prior Publication Data

US 2014/0262464 A1    Sep. 18, 2014

(51) Int. Cl.
| | |
|---|---|
| *H05K 1/18* | (2006.01) |
| *H05K 1/03* | (2006.01) |
| *H01L 25/16* | (2006.01) |
| *H04B 5/00* | (2006.01) |
| *H01G 4/33* | (2006.01) |
| *H01L 27/02* | (2006.01) |

(52) U.S. Cl.
CPC .............. *H05K 1/181* (2013.01); *H01L 25/16* (2013.01); *H01L 25/162* (2013.01); *H04B 5/005* (2013.01); *H04B 5/0012* (2013.01); *H04B 5/0075* (2013.01); *H05K 1/0306* (2013.01); *H05K 1/18* (2013.01); *H01G 4/33* (2013.01); *H01L 27/0288* (2013.01); *H01L 2224/48091* (2013.01); *H01L 2224/48137* (2013.01); *H01L 2224/48464* (2013.01)

(58) Field of Classification Search
CPC ........ H05K 1/18; H05K 1/181; H05K 1/0306
See application file for complete search history.

(56) References Cited

U.S. PATENT DOCUMENTS

| | | |
|---|---|---|
| 2009/0067116 A1 | 3/2009 | Fujii et al. |
| 2009/0243783 A1 | 10/2009 | Fouquet et al. |
| 2011/0291819 A1 | 12/2011 | Kaeriyama |

OTHER PUBLICATIONS

European Search Report and Search Opinion issued in counterpart European application No. 14157273.5, communication dated Oct. 15, 2014, 7 pages.

*Primary Examiner* — Jeremy C Norris
(74) *Attorney, Agent, or Firm* — Wolf, Greenfield & Sacks, P.C.

(57) ABSTRACT

A laterally coupled isolator includes a pair of isolator traces provided in a common dielectric layer and separated by a distance that defines the isolation strength of the system. Circuit designers can vary the lateral distance to tailor isolation rating to suit individual design needs. A second embodiment includes a semiconductor substrate, provided below the isolator traces that includes a communication circuit electrically coupled to one of the isolator devices.

33 Claims, 4 Drawing Sheets

100

400

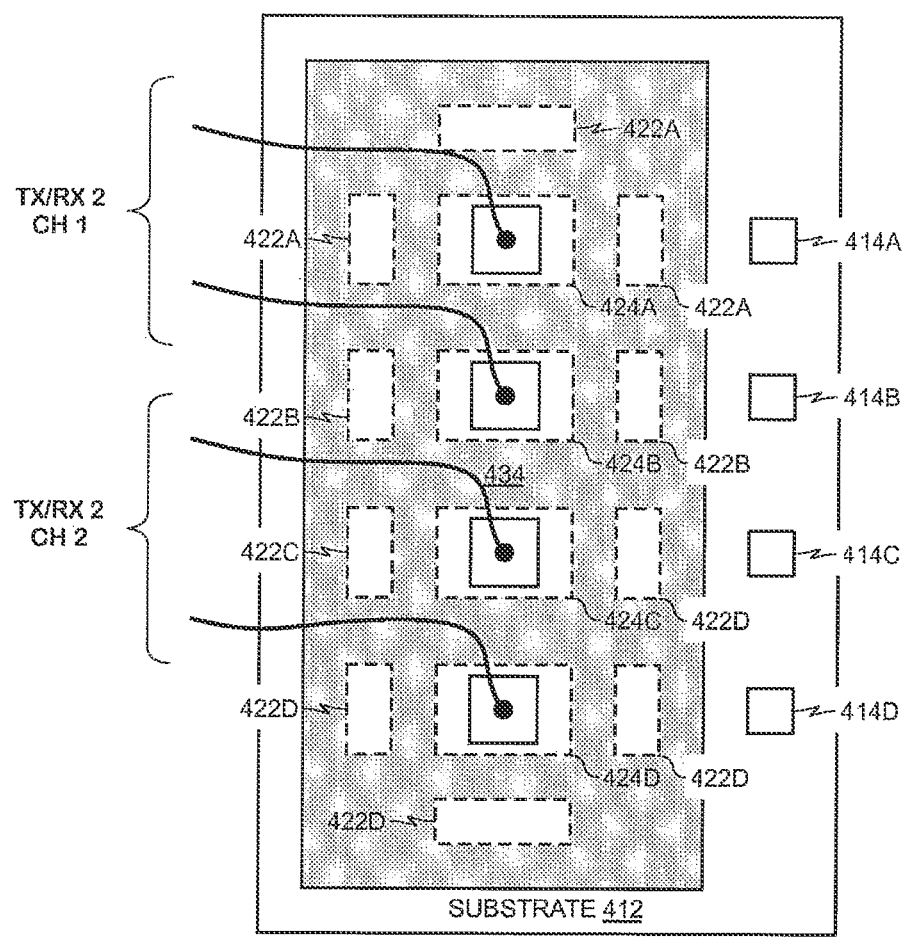

LATERALLY COUPLED ISOLATOR DEVICES

BACKGROUND

The present disclosure relates to isolator devices and, in particular, to isolator devices having laterally coupled interconnect.

Traditional isolators usually are vertically coupled, having a first interconnect on a first layer of a semiconductor package and a second interconnection on a second layer of the package. The vertical coupling arrangement can induce several limitations. First, the vertical isolation between top conducting layer and bottom conducting layer has a predetermined breakdown limitation, which can be controlled by managing the distance between the two points of interconnect. Increasing the isolation in a given design, for example, may require increasing the number of semiconductor layers that are designed into the semiconductor package, which increases cost. Another disadvantage of common vertical coupling arrangements arises because a potential of a bottom conducting layer of the package must be isolated from other layers. Thus, a large number of vertical isolation stacks has to be designed into the isolator, which again increases costs.

Accordingly, there is a need in the art for an isolator design that reduces the need for large numbers of dielectric layers provided in an isolator.

BRIEF DESCRIPTION OF THE DRAWINGS

FIGS. 4A and 4B illustrate an isolator system according to another embodiment of the present invention.

DETAILED DESCRIPTION

Embodiments of the present invention provide a laterally coupled isolator that includes a pair of isolator traces provided in a common dielectric layer and separated by a distance that defines the isolation strength of the system. Circuit designers can vary the lateral distance to tailor isolation rating to suit individual design needs. Varying lateral separation between isolator traces is expected to be inexpensive as compared to varying vertical separation between isolator traces in other designs. Moreover, for systems that include a semiconducting substrate under the isolator traces, a variation in distance separating the coupling elements from the substrate would induce twice the variation in isolation.

Figure 1:
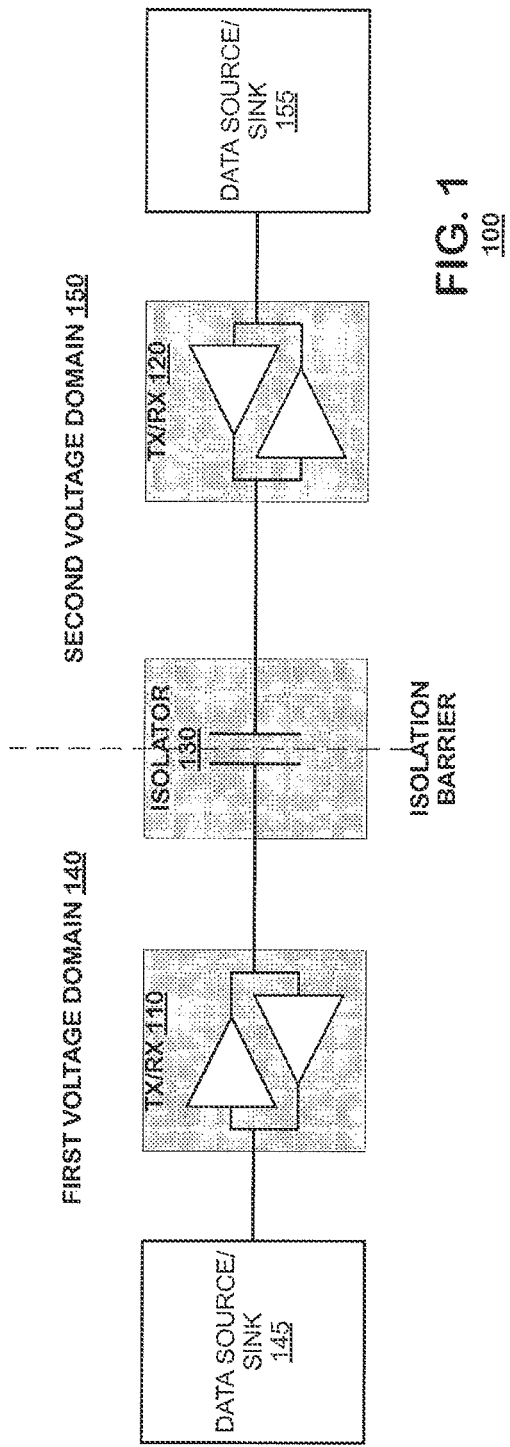
FIG. 1 is a block diagram of an isolator system according to an embodiment of the present invention.

Another aspect of the invention is to use laterally coupled elements in a way such the field is limited to the region within the elements, which may permit outer isolator traces, closer to a package edge, to act as shield. This design may permit lateral isolation distances from the traces to the package edge to be reduced, which should reduce overall package size and isolator cost FIG. 1 is a block diagram of an isolator system according to an embodiment of the present invention. The system 100 may include a pair of transceivers 110, 120 and an isolator 130 provided in mutual communication. The isolator 130 may define an isolation barrier that separates two voltage domains 140, 150 from each other. Each voltage domain 140, 150 may have independent voltage supplies and grounds from the other voltage domain 150, 140.

The transceivers 110, 120 each support communication of signals across the isolation barrier via the isolator 130. Thus, the system 100 illustrated in FIG. 1 demonstrates a bi-directional isolator 130 and bi-directional transceivers 110, 120. To transmit data across the isolator 130, the transceivers 110, 120 may receive data from an associated data source device, typically, another circuit in the system in which the isolator system 100 is being used. The transceiver 110, 120 may generate transmission signals that are appropriate for transmission across the isolator 130. The isolator 130 may transfer the transmission signals across the isolation barrier. The transceivers 110, 120 receive the transmission signals from the isolator 130 and generate recovered data signals therefrom, which may be output to channel sink circuits. Again, the channel sink devices may be other circuits in the system in which the isolator system 100 is being used.

The principles of the present invention also apply to unidirectional systems where, for example, a transmitter in the first voltage domain 140 would transmit data across the isolator 130 to a receiver in the second voltage domain 150. In such a case, one of the transceivers (say, 110) would be provided as a transmitter and the other transceiver 120 would be provided as a receiver.

Figure 2:
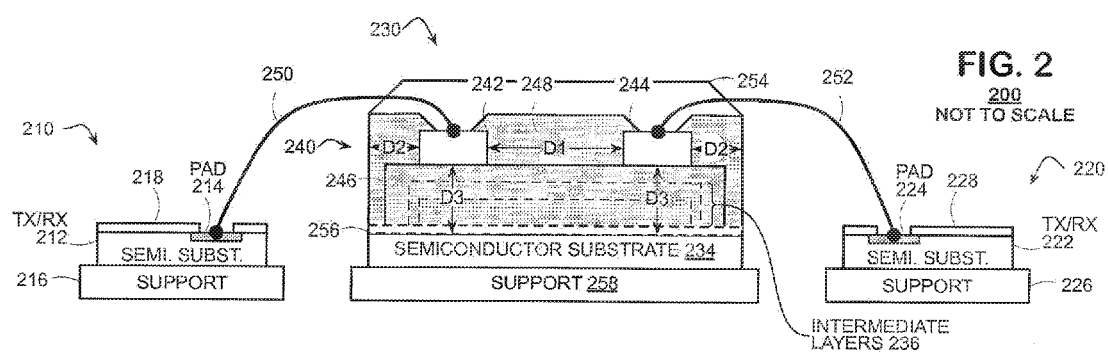
FIG. 2 schematically illustrates construction of an isolator system according to an embodiment of the present invention.

FIG. 2 schematically illustrates construction of an isolator system 200 according to an embodiment of the present invention. The system 200 may include a plurality of semiconductor chips 210, 220 and 230 provided for a first transceiver 212 (TX/RX), a second transceiver 222 (TX/RX) and an isolator 240 respectively. Circuitry of the first semiconductor chip 210 may be fabricated on a semiconductor substrate and may include bonding pads 214 for electrical connection between the TX/RX 212 and the isolator 240. The first semiconductor die 210 may be packaged in packaging materials that may include a support 216 and a dielectric passivation layer 218.

Similarly, circuitry of the second semiconductor chip 220 may be fabricated on a semiconductor substrate and may include bonding pads 224 for electrical connection between the TX/RX 222 and the isolator 240. The first semiconductor die 220 may be packaged in packaging materials that may include a support 226 and a dielectric passivation layer 228.

The third chip 230 may include the isolator 240 fabricated over a semiconductor substrate 234 and provided within a chip package. The isolator 240 may include first and second isolator traces 242, 244 mounted on a common layer 246 of the chip package, separated by dielectric material 248 of a first distance D1. In the example of FIG. 2, the isolator 240 is shown as a capacitor-based isolator. In such an embodiment, the isolator traces 242, 244 act as capacitor plates having a natural capacitance defined by the distance of separation D1 and the area of the traces along the distance of separation. The distance of separation D1 also defines an amount of isolation provided between the first and second voltage domains. By way of example, in an isolator having polyimide as the dielectric material 248, a distance of separation of D1=50 μm can provide 20 kV isolation. Hypothetically, doubling the distance of separation (D1=100 μm) will double the degree of isolation to 40 kV. The distance of separation D1, of course, may be tuned for individual design applications after consideration of appropriate balances of capacitance and isolation rating.

The isolator traces 242, 244 each may be encased in dielectric material to edges of the chip 230 by a second distance D2. The length of the second distance may define a degree of isolation provided between each of the isolator traces 242, 244 and the semiconductor substrate 234, which may be set at a common potential as the exterior shell of the chip 230. In the embodiment of FIG. 2, however, the semiconductor substrate 234 does not house either component of the isolator; here, both isolator traces 242, 244 are provided on a dielectric layer 248 that is separated (and isolated) from the semiconductor substrate. Accordingly, the length of the second distance D2 need not be provisioned to provide the full isolation needed to be maintained between the first and second isolator traces 242, 244. Typically, the second distance D2 is provisioned to be half that of the first distance D1.

The isolator traces 242, 244 may be mounted over a semiconductor substrate 234 on a common layer 246 of dielectric material. The isolator chip 230 may include one or more intermediate layers 236 of dielectric materials to define a third distance D3 between the isolator traces 242, 244 and the semiconductor substrate 234. The third distance D3 provides a second degree of capacitive coupling between the isolator traces 242, 244 as signal activity on one of the traces (say, trace 242) may generate electromagnetic coupling to the substrate 234, which may be reflected back to the second isolator trace 244. Again, the third distance D3 may define a degree of isolation between the first and second isolator traces 242, 244 and it may be tailored to provide an appropriate balance between a degree of capacitive coupling and isolation. A signal path from the isolator trace 242 to the semiconductor substrate 234 back to the second signal path 244 traverses twice through the third distance D3. Accordingly, a change to the third distance D3 may impart a two-fold change to the degree of isolation between the isolator traces 242, 244.

As shown, the isolator chip 230 may encase each of the isolator traces 242, 244 in dielectric material 248. During manufacture, layers of dielectric material may be deposited over a semiconductor substrate iteratively until the layer 246 is created on which the isolator traces 242, 244 are to be placed. The layer 246 and any intermediate layers 236 provided thereunder collectively may define the third distance D3. The layer 246 may have a depth and width sufficient to accommodate the shape(s) of the isolator traces 242, 244, the first distance of separation D1 between them and the second distances D2 on outer sides of the isolator traces 242, 244. The layers 236 and 246 may be fabricated according to photolithography techniques.

Once the layer 246 is constructed, the isolator traces 242, 244 may be formed on the layer, again by photolithography techniques. Again, the shape and size of the traces 242, 244 themselves as well as the distance of separation D1 may be tailored to individual application needs. Following formation of the traces 242, 244, the remaining dielectrics 248 may be provided in interstitial regions between the traces 242, 244 and on outer perimeters of the traces 242, 244. The dielectric 248 may include openings to accommodate electrical connections between the isolator 240 and the TX/RXs 212, 222 of the other chips 210, 220. The connections may be made by wirebond 250, 252 or other connections. Following electrical connection, the chip 230 may be capped by a further dielectric 254. In one embodiment, all dielectrics 236, 246, 248 and 254 may be made of polyimide.

In a further embodiment, the semiconductor substrate 234 may have a metallization layer 256 provided on a surface thereof beneath the dielectric layer(s) 236, 246. Such an embodiment may provide enhanced coupling between the isolator traces 242, 244 along the D3 path. In a further embodiment (not shown), the dielectric layer(s) may be provided on an insulating substrate such as glass or sapphire.

If another embodiment, the semiconductor substrate 234 may itself be provided on another support structure 258 to provide enhanced mechanical stability to the system 300. The support may be a lead frame or a plastic structure.

Although the embodiment of FIG. 2 has been presented in connection with a three chip configuration, other embodiments find application with two chip configurations. For example, the semiconductor substrate of one of the first or second TX/RX may be mounted on a common support as the semiconductor substrate 234 for the isolator. In such an embodiment, the isolator 240 and first TX/RX 212 may be provided in a first chip and the second TX/RX 224 may be provided in a second chip.

Figure 3A:
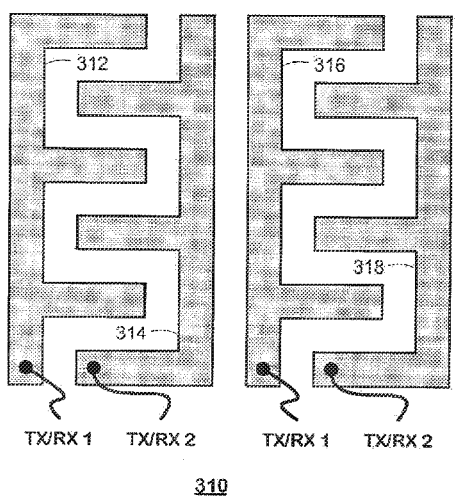
FIGS. 3A and 3B illustrate exemplary trace patterns according to an embodiment of the present invention.
Figure 3B:
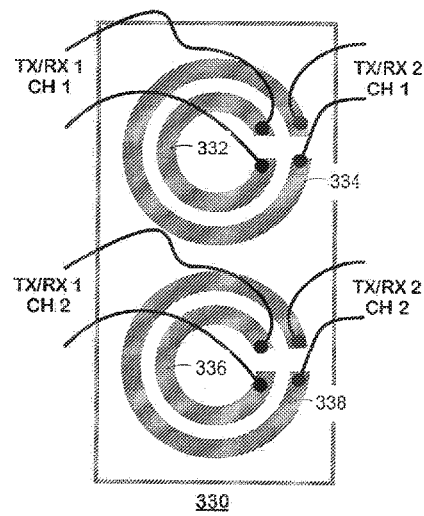

The principles of the present invention find application with a variety of isolator architectures, including both capacitive and inductive isolators. FIGS. 3A and 3B illustrate exemplary trace patterns 310-320 that may be used as isolator traces in the foregoing embodiments. In each case, the traces may be separated by the first distance D1 to provide desired isolation between the traces. FIG. 3A illustrates exemplary trace pairs 312/314, 316/318 separated by the distance D1. Typically, a dual capacitor isolator supports a single communication channel, providing a length of conductor for each capacitor plate 312, 314, 316 and 318. FIG. 3B illustrates a pair of capacitive isolators having two pairs of traces 322/324 and 326/328 separated by the distance D1; the isolators may support a pair of communication channels. Of course, other trace patterns may be used consistent with the principles of the present invention.

Figure 4A:
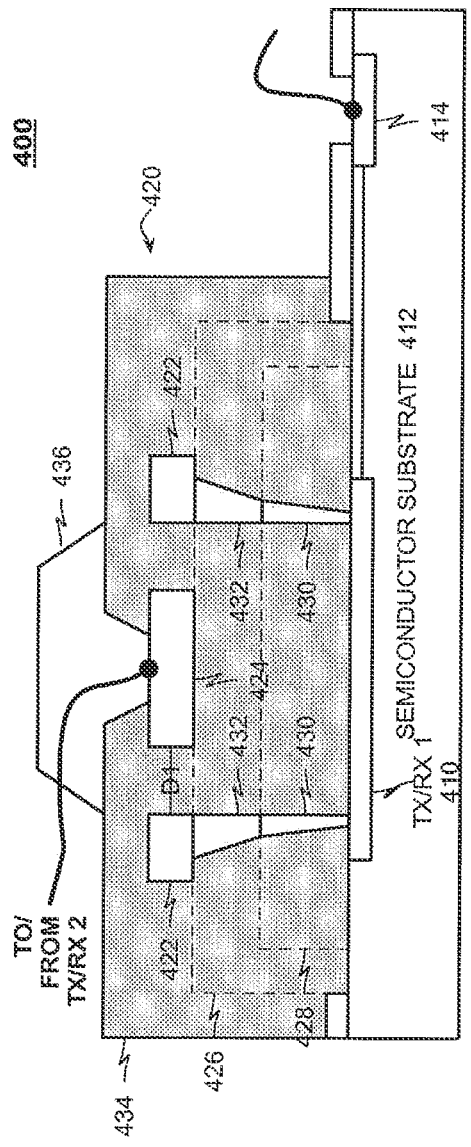

FIG. 4A illustrates an isolator system 400 according to another embodiment of the present invention. The system 400 may include a transceiver circuit (TX/RX) 410 and isolator 420 provided in a common package. The TX/RX 410 may be fabricated in a semiconductor substrate 412. The TX/RX 410 may be coupled to bonding pad(s) 414 provided in the semiconductor substrate 412 for electrical connection with data source(s) and/or data sink(s) that supply data to and/or receive data from the TX/RX 410.

The isolator 420 may be fabricated over the TX/RX 410 and the semiconductor substrate 413. The isolator 420 may be formed of a plurality of traces 422, 424 provided in a common dielectric layer 426. In the embodiment illustrated in FIGS. 4A and 4B, one of the traces 422 may be provided around a circumference of the second trace 424. The traces 422, 424 may be separated from each other by a distance D1 that defines both isolation and coupling between the traces 422, 424.

The isolator traces 422, 424 may be mounted over a semiconductor substrate 412 on a common layer 426 of dielectric material. The isolator system 400 may include one or more intermediate layers 428 of dielectric materials. The layers 426, 428 may include conductive post(s) 430, 432 provided therein that electrically connect the isolator trace(s) 422 on one voltage domain to appropriate circuitry within the TX/RX 410. The isolator traces 422, 424 may be encased in an external dielectric layer 434 to maintain isolation between the traces 422, 424 and package exterior of the system 400. The external layer 434 may include an opening to accommodate a conductor from a second TX/RX (not shown), which may be capped by a capping dielectric 436.

FIG. 4B is a top view of an isolator system 400 according to the embodiment of FIG. 4A. FIG. 4B illustrates an exemplary two-channel system in which a pair of isolators carry common data differentially within the system 400. Thus, FIG. 4B illustrates pairs of traces 422A/424A and 422B/424B for a first communication channel and pairs of traces 422C/424C and 422D/424D for a second communication channel. Each trace 424A, 424B, 424C and 424D from a first voltage domain is surrounded by a trace 422A, 422B, 422C and 422D from a second voltage domain. Thus, the traces 422A, 422B, 422C and 422D reduce propagation of electromagnetic signals toward an exterior of the isolator package.

The embodiment of FIGS. 4A and 4B contribute to a smaller isolator package in several ways. First, one of the transceivers 410 or the system 400 may be fabricated under the isolator 420, rather than adjacent to the isolator 420, and thus reduces the lateral profile of the package. Second, by having traces 422A, 422B, 422C and 422D provided about a periphery of the center traces 424A, 424B, 424C and 424D, a peripheral length of the dielectric materials made be made shorter than in other designs, which again can contribute to reduced package profile.

Several embodiments of the invention are specifically illustrated and/or described herein. However, it will be appreciated that modifications and variations of the invention are covered by the above teachings and within the purview of the appended claims without departing from the spirit and intended scope of the invention.

I claim:

1. An isolator system, comprising:
    first and second isolator traces provided on a common dielectric layer within a first distance apart from each other,
    a first communication circuit electrically coupled to the first isolator trace,
    a second communication circuit electrically coupled to the second isolator trace,
    wherein electrical connections between the first communication circuit and the first isolator trace and between the second communication circuit and the second isolator trace are provided on the common dielectric layer,
    wherein the common dielectric layer is fabricated over a semiconductor substrate.

2. The isolator system of claim 1, further comprising a plurality of intermediate layers provided between the common dielectric layer and the semiconductor substrate.

3. The isolator system of claim 1, further comprising a metallization layer provided between the common dielectric layer and the semiconductor substrate.

4. The isolator system of claim 1, further comprising an insulator substrate layer provided between the common dielectric layer and the semiconductor substrate.

5. The isolator system of claim 1, wherein the first and second isolator traces are encased in dielectric material having a length from the traces to an exterior edge of the dielectric material at least half the first distance.

6. The isolator system of claim 1, wherein the first and second isolator traces are capacitively coupled.

7. The isolator system of claim 1, wherein the first and second isolator traces are inductively coupled.

8. The isolator system of claim 1, wherein the first communication circuit is fabricated on the semiconductor substrate below the first and second traces.

9. The isolator system of claim 1, wherein the first communication circuit is provided on a common first package as the first and second isolator traces, and the second communication circuit is provided in a second package, separate from the first package.

10. The isolator system of claim 1, wherein the first communication circuit, the first and second isolator traces, and the second communication circuit are provided in separate packages from each other.

11. The isolator system of claim 1, wherein the first and second communication circuits are bidirectional communication circuits.

12. The isolator system of claim 1, wherein the first and second communication circuits are unidirectional communication circuits.

13. An isolator system, comprising:
    first and second isolator traces provided on a common dielectric layer within a first distance apart from each other,
    a semiconductor substrate provided below the common layer,
    a first communication circuit provided within the semiconductor substrate and below at least a portion of the first or second isolator traces, the first communication circuit electrically coupled to the first isolator trace.

14. The isolator system of claim 13, wherein one of the first and second isolator traces surrounds a periphery of the other of the first and second isolator traces.

15. The isolator system of claim 13, further comprising a post extending through dielectric layers separating the semiconductor substrate from the common layer, connecting the first communication circuit to the first isolator trace.

16. The isolator system of claim 13, wherein the first and second isolator traces are capacitively coupled.

17. The isolator system of claim 13, wherein the first and second isolator traces are inductively coupled.

18. The isolator system of claim 13, wherein the first and second communication circuits are bidirectional communication circuits.

19. The isolator system of claim 13, wherein the first and second communication circuits are unidirectional communication circuits.

20. The isolator system of claim 13, further comprising a second communication circuit provided in a first package separate from a second package which includes the first communication circuit and the first and second isolator traces.

21. The isolator system of claim 1, wherein the first communication circuit is fabricated over a second semiconductor substrate, and the second communication circuit is fabricated over a third semiconductor substrate.

22. The isolator system of claim 1, wherein the isolator traces are fabricated over an insulator substrate.

23. An isolator system, comprising:
    a first communication circuit provided on a first semiconductor substrate;
    a second communication circuit;
    an isolator circuit provided on a second semiconductor substrate, the isolator circuit including first and second isolator traces provided on a common dielectric layer within a first distance apart from each other,
    wherein the first communication circuit is electrically coupled to the first isolator trace, and the second communication circuit is electrically coupled to the second isolator trace,
    wherein the common dielectric layer is fabricated over the second semiconductor substrate.

24. The isolator system of claim 23, wherein the second communication circuit is provided on a third semiconductor substrate.

25. The isolator system of claim 23, wherein the second communication circuit is provided on the second semiconductor substrate.

26. The isolator system of claim 23, wherein the second communication circuit and the isolator circuit are provided in a common package.

27. The isolator system of claim 23, further comprising a metallization layer provided between the common dielectric layer and the second semiconductor substrate.

28. The isolator system of claim 23, further comprising an insulator substrate layer provided between the common dielectric layer and the second semiconductor substrate.

29. The isolator system of claim 23, wherein the first and second isolator traces are encased in dielectric material having a length from the traces to an exterior edge of the dielectric material at least half the first distance.

30. The isolator system of claim 23, wherein the isolator traces are provided on top of an insulator substrate.

31. The isolator system of claim 23, wherein the first and second isolator traces are capacitively coupled.

32. The isolator system of claim 23, wherein the first and second isolator traces are inductively coupled.

33. The isolator system of claim 23, wherein the first and second communication circuits are bidirectional communication circuits.

* * * * *